United States Patent [19]

Davey

[11] 4,160,905
[45] Jul. 10, 1979

[54] ELECTRON MICROSCOPES

[75] Inventor: Julian P. Davey, Manchester, England

[73] Assignee: Kratos Limited, England

[21] Appl. No.: 852,717

[22] Filed: Nov. 18, 1977

[30] Foreign Application Priority Data

Nov. 27, 1976 [GB] United Kingdom ............... 49581/76

[51] Int. Cl.$^2$ ............................................. G01N 23/00
[52] U.S. Cl. ..................................... 250/311; 250/306
[58] Field of Search ................ 250/311, 306, 310, 305

[56] References Cited

U.S. PATENT DOCUMENTS

| 3,256,433 | 6/1966 | Watanabe et al. ................... 250/305 |
| 3,863,069 | 1/1975 | Shirota ................................. 250/305 |

Primary Examiner—Harold A. Dixon
Attorney, Agent, or Firm—Leydig, Voit, Osann, Mayer & Holt, Ltd.

[57] ABSTRACT

The electron microscope has an evacuated housing 9 comprising a portion 14 containing an electron gun 10 from which a beam 11 of electrons is accelerated by accelerator 12 and directed into a microscopic column 16 forming part of housing 9. An ion-stopping member 33 is located in the accelerator 12 on the axis of column 16, to intercept ions which could otherwise pass to the specimen S. In order to avoid interception of the electron beam, the beam is directed along a path which avoids the member 33, either by a displacement or inclination of the gun or by electron beam deflection means (e.g. coils 35c, 36c), and the beam is deflected back on to the axis of the column 16 by electron beam deflection means (e.g. coils 33c, 34c).

5 Claims, 4 Drawing Figures

ELECTRON MICROSCOPES

This invention relates to electron microscopes. More particularly the invention relates to high voltage electron microscopes in which the electron beam is accelerated through electrostatic potentials of the order of 1 MV or higher.

In such an electron microscope, an electron beam is produced within an electron gun and is accelerated to a high energy by accelerating means before passing into an electron microscope column. The whole of the electron path within the gun, accelerating means and microscope column is evacuated to a high vacuum so that the electrons can travel through the system with a low probability of undergoing collision with residual gas molecules in the system.

One of the applications of the high voltage electron microscope is the study of electron induced specimen damage, that is the study of changes in the specimen arising as a result of interactions between the electron beam and the atoms of the specimen, such studies frequently requiring the use of accelerating voltages of 1 MV or higher. A disadvantage of the instrument that has become apparent during such studies is that, in addition to electron damage, unwanted damage to the specimen can also be caused by negatively charged ions which are produced within the electron gun and accelerating means from material desorbed from the surfaces under vacuum and which are accelerated by the potentials on the accelerating electrodes so as to enter the microscope column along the axis of the accelerating means or at an inclination to this axis. These ions, having masses many times heavier than those of electrons, are virtually unaffected by the electron beam controlling and positioning devices of the microscope column and pass through to the specimen so causing the unwanted specimen damage.

Accordingly a requirement exists for means for preventing such charged ions from reaching the specimen whilst permitting the electron beam still to pass through the specimen.

According to the present invention there is provided an electron microscope comprising an evacuable housing which includes a microscope column, an electron gun in said housing, an accelerator in said housing for receiving electrons from the gun and directing a beam of the electrons into the microscope column, the microscope having means for locating a specimen in a specimen position therein, the housing having therein two members spaced apart on the axis of the column and each having an aperture therein, the apertures being aligned to allow the electron beam to pass therethrough, an ion-stopping member disposed with respect to said members to block the straight line paths along which any ions could otherwise pass through said apertures to said specimen position and electron guide means for constraining said beam of electrons travelling from the electron gun to the specimen position to follow a path which avoids the ion-stopping member.

The present invention will now be particularly described by way of example with reference to a number of microscope constructions in accordance with the invention which are illustrated in the accompanying drawings. In the drawings.

Figure 1:
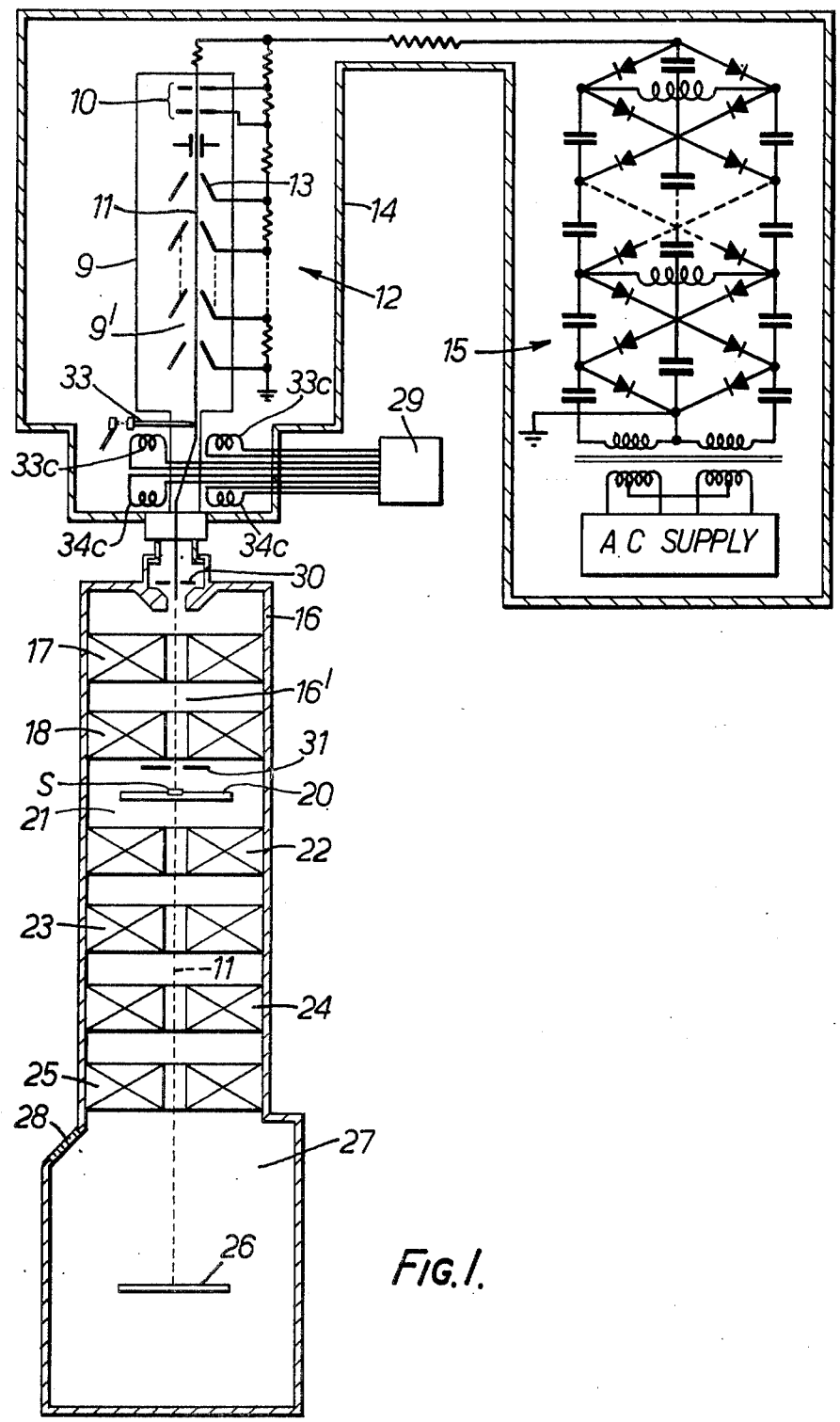
FIG. 1 is a diagrammatic sectional view of a high voltage electron microscope having a system for blocking the path of negatively charged ions approaching a specimen.

As shown in FIG. 1 the electron microscope comprises an evacuated chamber 9', 16' defined within a housing which comprises an upper housing part 9 and a lower housing part formed by a microscope column 16. The upper housing part 9 contains an electron gun 10 within which an electron beam 11 is produced and accelerated to high energies by the potentials applied to electrodes 13 of an accelerator 12. The upper housing part 9 is contained within a pressurised outer vessel 14. The accelerator 12 and a generator 15 for supplying the accelerator are known components which form no part of the present invention and their construction and circuitry are therefore illustrated only diagrammatically.

The beam passes from the accelerator 12 into the electron microscope column 16 which contains condenser lenses 17, 18 which focus the beam to a fine spot. A specimen support 20 is provided in a specimen chamber 21 of the column on which support a specimen S is mounted. Electrons transmitted through the specimen pass through an objective lens 22 and projector lenses 23, 24, 25 which produce a magnified electron optical image of a portion of the specimen. This image is made visible by means of a fluorescent screen 26 positioned in a viewing chamber 27 which is provided with an observation window 28.

Figure 2:
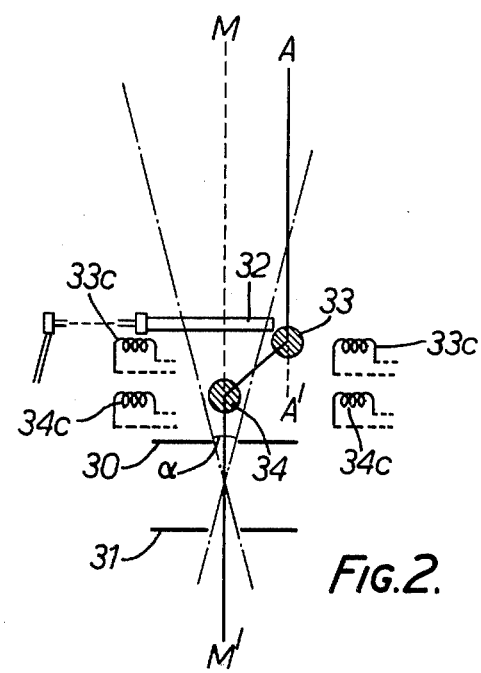
FIG. 2 is a diagrammatic sectional view of one embodiment of the system.

One system for blocking the path of heavy ions is shown in FIG. 1 but reference is directed to the larger scale representation in FIG. 2 in which MM' is the axis of the microscope column, and angle α represents, in one plane, the solid angle within which heavy particles, which are undeviated by the microscope lenses and electron deflection devices, can enter the column and pass to the specimen. This angle is defined by apertured members 30, 31 within the housing (see FIG. 1).

This solid angle can be completely blocked by an adjustable ion beam stop 32. The position of the ion beam stop 32 can be controlled and adjusted by linkages (not shown) operable from outside the evacuated chamber and the pressurised vessel 14, to prevent direct access in a straight line of particles travelling from the accelerator into the specimen chamber 21. The beam stop can be formed by a rod, for example of aluminium.

The accelerator axis AA' down which the electron beam passes in the system of FIG. 2 is displaced laterally with respect to the microscope axis MM' so that the electron beam is not intercepted by the beam stop 32 and the electron beam is then deflected back onto and along the column axis by two stages of equal but opposite magnetic deflections as shown at 33 and 34. These magnetic deflections are effected by electron deflection means in the form of suitable pairs of coils 33c, 34c through which a controllable direct current is passed from a source 29 (see FIG. 1) as is well known to those versed in the art. The coils are shown only diagrammatically and are arranged to produce a field which, where intersected by the electron beam, is perpendicular to the plane of the undeflected and deflected portions of the electron beam. The magnetic fields produced by the coils are illustrated diagrammatically by cross-hatched circles.

Figures 3, 4:
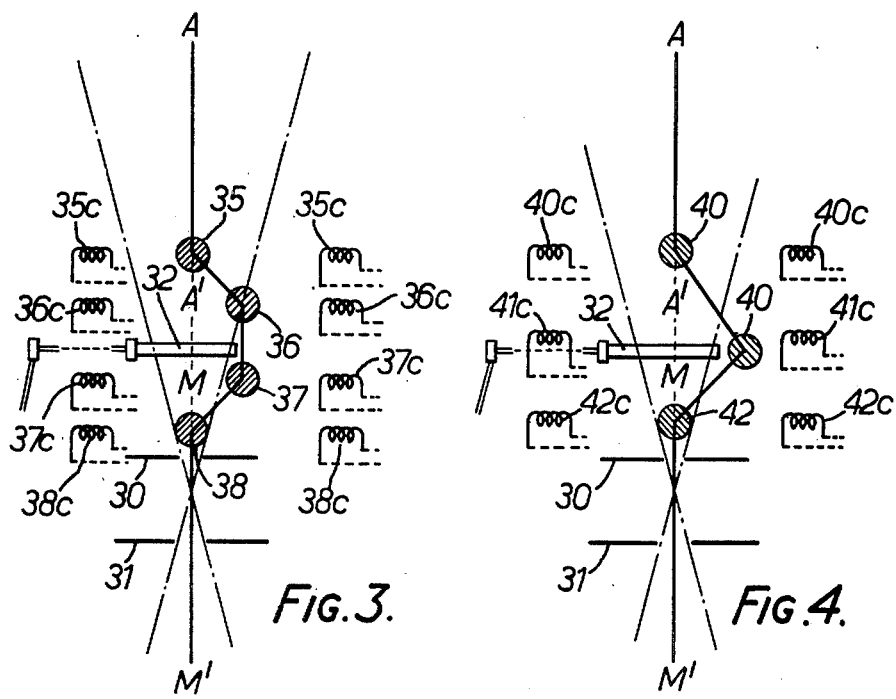
FIGS. 3 and 4 are diagrammatic sectional views of two modifications of the system shown in FIG. 2.

In the modified system illustrated in FIG. 3, the accelerator 12 is coaxial with the column 16 the electron beam is deflected to avoid the beam stop 32 by two equal and opposite magnetic deflections at 35 and 36 following which it is brought back onto the column axis by two further magnetic deflections at 37 and 38. These deflections are produced by coils 35c, 36c, 37c 38c respectively connected to the source 29 (not shown in FIG. 3).

In a further modified system illustrated in FIG. 4 the beam undergoes a first deflection at 40 away from the common axis of the accelerator and the column, a second deflection at 41 or near to the plane of the beam stop 32 to return the beam towards the axis and a third deflection at 42 on the axis to re-align the beam with the common axis. These deflections are produced by coils 40c, 41c and 42c connected to the source 29 (not shown in FIG. 4).

It will thus be seen that the deflection of the beam to avoid the beam stop can be effected by suitably arranged magnetic fields, but if desired a combination of magnetic and electric fields can be used, by itself or in combination with a displacement or tilting of the accelerator axis away from the column axis.

It will be appreciated that the axis of the accelerator and the axis of the microscope column do not have to be colinear but can be parallel spaced from one another or at an inclination to one another. The angles through which the electron beam is deflected in order for it to by-pass the ion beam stop 32 will be adjusted accordingly. A suitably large inclination of the axis of the accelerator would enable the first deflection at 33, 35 or 40 to be omitted.

I claim:

1. An electron microscope comprising
   an evacuable housing,
   a microscope column, forming part of said housing,
   an electron gun in said housing,
   an accelerator in said housing for receiving electrons from the gun and directing a beam of the electrons into the microscope column,
   means in the column for locating a specimen in a specimen position therein,
   two members in said housing and spaced apart on the axis of the column, each member having an aperture therein, the apertures being aligned to allow the electron beam to pass therethrough,
   an ion-stopping member in said housing disposed with respect to said members to block the straight line paths along which any ions could otherwise pass through said apertures to said specimen position and
   electron guide means for constraining said beam of electrons travelling from the electron gun to the specimen position to follow a path which avoids the ion-stopping member.

2. An electron microscope according to claim 1 wherein the electron guide means comprise
   electron deflection means for receiving a beam of electrons which is travelling along a path which avoids the ion-stopping member and is remote from an axis on which said apertures are aligned, and deflecting said beam to a location at which it intersects said axis, and
   further electron deflection means for receiving the beam at said location and deflecting it to travel along said axis toward said specimen position.

3. An electron microscope according to claim 2 having primary electron deflection means located on said axis for receiving a beam of electrons travelling along said axis and deflecting it along said path which avoids the ion-stopping member and towards a position at which the first-mentioned electron deflection means can deflect the beam.

4. An electron microscope according to claim 3 wherein said first-mentioned deflection means comprise upstream and downstream electron deflection devices, said upstream electron deflection device being located to receive the electron beam from said primary electron deflection means and deflect it to the downstream electron deflection device and the downstream electron deflection device being arranged to deflect the electron beam received thereby along a path which is received by said further electron deflection means.

5. An electron microscope according to claim 1 wherein the electron guide means comprise electron deflection means located at the intersection of an axis on which said apertures are aligned with the path of a beam of electrons which has avoided the ion-stopping member and operative to deflect the beam of electrons along said axis toward said specimen position.

* * * * *